(12) United States Patent
Watanabe et al.

(10) Patent No.: US 8,547,014 B2
(45) Date of Patent: Oct. 1, 2013

(54) ORGANIC EL DEVICE AND ELECTRONIC APPARATUS

(75) Inventors: Shotaro Watanabe, Chino (JP); Masahiro Uchida, Chino (JP)

(73) Assignee: Seiko Epson Corporation, Tokyo (JP)

(*) Notice: Subject to any disclaimer, the term of this patent is extended or adjusted under 35 U.S.C. 154(b) by 572 days.

(21) Appl. No.: 12/557,200

(22) Filed: Sep. 10, 2009

(65) Prior Publication Data

US 2010/0084968 A1     Apr. 8, 2010

(30) Foreign Application Priority Data

Oct. 3, 2008 (JP) ................................ 2008-258587
Jul. 13, 2009 (JP) ................................ 2009-164937

(51) Int. Cl.
| H01L 51/00 | (2006.01) |
| H01L 51/50 | (2006.01) |
| H01L 51/52 | (2006.01) |
| H01L 51/54 | (2006.01) |

(52) U.S. Cl.
USPC ........................... 313/506; 313/504; 313/503

(58) Field of Classification Search
USPC ................................................. 313/498–512
See application file for complete search history.

(56) References Cited

U.S. PATENT DOCUMENTS

| 5,814,416 | A  | * | 9/1998 | Dodabalapur et al. | 428/690 |
| 7,405,515 | B2 | * | 7/2008 | Satake | 313/512 |
| 7,531,958 | B2 | * | 5/2009 | Nishikawa et al. | 313/504 |
| 7,816,677 | B2 | * | 10/2010 | Lee et al. | 257/40 |
| 7,903,055 | B2 | * | 3/2011 | Nishikawa et al. | 345/77 |
| 2005/0225232 | A1 | * | 10/2005 | Boroson et al. | 313/504 |
| 2005/0266763 | A1 |   | 12/2005 | Kimura et al. | |
| 2008/0164809 | A1 | * | 7/2008 | Matsunami et al. | 313/504 |
| 2008/0218068 | A1 | * | 9/2008 | Cok | 313/505 |
| 2008/0224968 | A1 | * | 9/2008 | Kashiwabara | 345/83 |
| 2008/0297043 | A1 | * | 12/2008 | Nishikawa et al. | 313/504 |
| 2009/0026946 | A1 | * | 1/2009 | Satake | 313/512 |
| 2009/0085477 | A1 | * | 4/2009 | Hwang et al. | 313/504 |
| 2009/0108743 | A1 | * | 4/2009 | Kobayashi | 313/504 |
| 2009/0109435 | A1 | * | 4/2009 | Kahen et al. | 356/317 |
| 2009/0200544 | A1 | * | 8/2009 | Lee et al. | 257/40 |
| 2009/0302760 | A1 | * | 12/2009 | Tchakarov et al. | 313/512 |
| 2010/0052524 | A1 | * | 3/2010 | Kinoshita | 313/504 |

FOREIGN PATENT DOCUMENTS

| JP | A-2006-012762 | 1/2006 |
| JP | A-2007-289825 | 11/2007 |
| JP | A-2007-289826 | 11/2007 |
| JP | A-2007-310156 | 11/2007 |

* cited by examiner

*Primary Examiner* — Anne Hines
*Assistant Examiner* — Jose M Diaz
(74) *Attorney, Agent, or Firm* — Oliff & Berridge, PLC

(57) ABSTRACT

An organic EL device includes an organic EL element that includes an anode having a reflective face, a cathode having a semi-transmissive reflective layer, and a functional layer, which is pinched between the anode and the cathode and includes at least an organic light emitting layer, and configures a color pixel that implements light emission corresponding to at least a red color. The color pixel configured by the organic EL element forms an optical resonator between the reflective face of the anode and the semi-transmissive reflective layer of the cathode. The color pixel corresponding to the red color has a film thickness profile of the functional layer in a convex shape in which a center portion is relatively thick, and a periphery portion is relatively thin or a concave shape in which the center portion is relatively thin, and the periphery portion is relatively thick.

4 Claims, 11 Drawing Sheets

ORGANIC EL DEVICE AND ELECTRONIC APPARATUS

BACKGROUND

1. Technical Field

The present invention relates to an organic EL device and an electronic apparatus.

2. Related Art

Recently, as technology for forming a functional film such as a light emitting layer (functional layer) of an organic electroluminescence device (organic EL device) or a color filter film of a color liquid crystal device, technology in which the functional film is formed by coating a liquid-phase material including a functional film forming material by using a liquid droplet ejecting method such as an ink jet method and by drying the liquid-phase material has been known.

However, such a functional film has different functional characteristics depending on the thickness thereof. Accordingly, for example, among pixels of an organic EL device that implement emission of a red color (R), a green color, and a blue color (B), in order for the functional layers such as light emitting layers to exhibit the same function (characteristics) among the pixels of the same color, the film thickness is required to be uniform. For the same reason, also in each unit of the functional film, when there is unevenness of the film thickness, uneven light emission occurs. Accordingly, the thickness of each portion of the entire functional film needs to be uniform.

However, the functional film that is formed by using the liquid droplet ejecting method is formed by drying the liquid-phase material. Thus, the functional film is frequently formed in a convex shape in which, for example, the center portion is relatively thick, and the periphery portion is relatively thin or conversely is frequently formed in a concave shape in which the center portion is relatively thin and the periphery portion is relatively thick. Accordingly, it is difficult to form the film thickness to be uniform.

In particular, an organic EL device of the bottom-emission type tends to have a light emission profile that depends on the shape of a film (film thickness profile). Thus, when the film thickness is formed to be uneven, light emission within the same film is uneven, whereby generating "uneven light emission".

Accordingly, it is difficult to acquire uniform light emission having no unevenness in each unit of the organic electroluminescence element (organic EL element) that configures each light emission pixel in the organic EL device of the bottom-emission type manufactured by using a liquid droplet ejecting method.

Typically, in order to acquire a flat film shape by using the ink jet method (liquid droplet ejecting method), for example various enhancements have been made by using technology disclosed in JP-A-2006-12762, JP-A-2007-289825, JP-A-2007-289826, and JP-A-2007-310156.

However, a particular process is needed for using the above-describe technology, and it is still difficult to easily acquire the flat film shape.

On the other hand, a same convex or concave-shape as the shape of the film (film thickness profile) can be frequently acquired in an easy manner with excellent reproducibility, compared to a case where a flat film shape of the same shape is acquired, and the film thickness profile thereof can be controlled to some degree.

SUMMARY

An advantage of some aspects of the invention is that it provides an organic EL device and an electronic apparatus including the organic EL device capable of decreasing unevenness of light emission in color pixels corresponding to the red color or the blue color by forming the functional film formed by using the liquid droplet ejecting method to be a desired film-thickness profile and having the light emission profile acquired by the film-thickness profile to be fixed in the external view.

The organic EL devices of the bottom emission type tend to have the light emission profile that depends on the shape of the film (film-thickness profile). Accordingly, it is difficult to acquire uniform light emission having no unevenness for each light emitting element (each organic EL element) in the organic EL devices of the bottom emission type. On the other hand, in the top emission type, the film-thickness profile needs not to be flat, and a convex-shaped or concave-shaped film-thickness profile may be rather advantageous in some cases. The reason is that the effect of light resonance, which does not have much influence on the light emission of the organic EL devices of the bottom-emission type, has much influence on the light emission of the organic EL devices of the top-emission type. The inventor has accomplished the invention based on the above-described knowledge.

According to a first aspect of the invention, there is provided an organic EL device including an organic EL element that includes an anode having a reflective face, a cathode having a semi-transmissive reflective layer, and a functional layer, which is pinched between the anode and the cathode and includes at least an organic light emitting layer, and configures a color pixel that implements light emission corresponding to at least a red color. The color pixel configured by the organic EL element forms an optical resonator between the reflective face of the anode and the semi-transmissive reflective layer of the cathode, and the color pixel corresponding to the red color has a film thickness profile of the functional layer in a convex shape in which a center portion is relatively thick, and a periphery portion is relatively thin or a concave shape in which the center portion is relatively thin, and the periphery portion is relatively thick, and the film thickness R(a) of the center portion of the convex-shaped functional layer or the film thickness R(a) of the peripheral portion of the concave-shaped functional layer satisfies Equations (1) and (2) relating to the length d1 of a resonance light path of the optical resonator.

$$2d1 = m\lambda + (\theta an^* \lambda)/2\pi + (\theta ca^* \lambda)/2\pi \qquad \text{Equation (1)}$$

(Here, m is an integer, $\lambda$ is a peak wavelength of the spectrum of light desired to be emitted, $\theta$an is the amount of phase shift in the case of reflection from the anode side, and $\theta$ca is the amount of phase shift in the case of reflection from the cathode side.)

$$0.9(d1) \leq R(a) \leq 1.1(d1) \qquad \text{Equation (2)}$$

According to the above-described organic EL device, in the color pixel corresponding to the red color, the film thickness R(a) of the center portion of the convex-shaped functional layer or the film thickness R(a) of the periphery portion of the concave-shaped functional layer satisfies Equations (1) and (2) relating to the length d1 of a resonance light path of the optical resonator. Accordingly, in the portion of the film thickness R(a), the light transmittance (output ratio) becomes almost the maximum due to the effect of the light resonance. In addition, the film thickness R(a) is set so as to satisfy the above-described Equations (1) and (2). Accordingly, in the portion of the film thickness R(a), light of the desired wavelength range (red wavelength range) that has been set is emitted, and whereby red light of the desired wavelength as designed can be acquired.

In addition, in the color pixel corresponding to the red color, the film-thickness profile of the above-described functional layer is formed in the convex shape or the concave shape. Thus, compared to the center portion or the periphery portion in which almost the maximum light transmittance (output ratio) is acquired due to the effect of the light resonance, the film thickness is thin, and whereby the light transmittance (output ratio) becomes low in the periphery portion or the center portion that is located on the opposite side.

However, on the opposite side, the light transmittance becomes low, and the wavelength of the emitted light is slightly shifted to the shorter wavelength side, that is, the green color side due to the effect of light resonance. Here, the human eyes have the highest visual sensitivity for the green color, and accordingly, even when the luminance is low more or less, the external luminance (light emitting intensity) detected by the eyes is high relative to the red color or the blue color. In other words, in the color pixel corresponding to the red color, on a side having a thick film thickness, the red light as designed is visually recognized. On the other hand, on the side having a thin film thickness, red light of the wavelength shifted to the green color side is visually recognized. As a result, although the actual luminance is slightly lower than that of the thick side, the external luminance (light emission intensity) detected by the eyes becomes equivalent to that of the thick side.

Therefore, according to the above-described organic EL device, the acquired light emitting profile becomes fixed in the external view for the color pixel corresponding to the red color. Accordingly, the above-described organic EL device has superior characteristics with unevenness of light emission decreased for the red color pixel.

According to a second aspect of the invention, there is provided an organic EL device including an organic EL element that includes an anode having a reflective face, a cathode having a semi-transmissive reflective layer, and a functional layer, which is pinched between the anode and the cathode and includes at least an organic light emitting layer, and configures a color pixel that implements light emission corresponding to at least a blue color. The color pixel configured by the organic EL element forms an optical resonator between the reflective face of the anode and the semi-transmissive reflective layer of the cathode, and the color pixel corresponding to the blue color has a film thickness profile of the functional layer in a concave shape in which a center portion is relatively thin, and a periphery portion is relatively thick or a convex shape in which the center portion is relatively thick, and the periphery portion is relatively thin, and the film thickness B(a) of the center portion of the concave-shaped functional layer or the film thickness B(a) of the peripheral portion of the convex-shaped functional layer satisfies Equations (1) and (3) relating to the length d1 of a resonance light path of the optical resonator.

$$2d1 = m\lambda + (\theta an^* \lambda)/2\pi + (\theta ca^* \lambda)/2\pi \qquad \text{Equation (1)}$$

(Here, m is an integer, λ is a peak wavelength of the spectrum of light desired to be emitted, θan is the amount of phase shift in the case of reflection from the anode side, and θca is the amount of phase shift in the case of reflection from the cathode side.)

$$0.9d1 \leq B(a) \leq 1.1d1 \qquad \text{Equation (3)}$$

According to the above-described organic EL device, in the color pixel corresponding to the blue color, the film thickness B(a) of the center portion of the concave-shaped functional layer or the film thickness B(a) of the periphery portion of the convex-shaped functional layer satisfies Equations (1) and (3) relating to the length d1 of a resonance light path of the optical resonator. Accordingly, in the portion of the film thickness B(a), the light transmittance (output ratio) becomes almost the maximum due to the effect of the light resonance. In addition, the film thickness B(a) is set so as to satisfy the above-described Equations (1) and (3). Accordingly, in the portion of the film thickness B(a), light of the desired wavelength range (blue wavelength range) that has been set is emitted, and whereby blue light of the desired wavelength as designed can be acquired.

In addition, in the color pixel corresponding to the blue color, the film-thickness profile of the above-described functional layer is formed in the concave shape or the convex shape. Thus, compared to the periphery portion or the center portion in which almost the maximum light transmittance (output ratio) is acquired due to the effect of the light resonance, the film thickness is relatively thick, and whereby the light transmittance (output ratio) becomes low in the center portion or the periphery portion that is located on the opposite side.

However, on the opposite side, the light transmittance becomes low, and the wavelength of the emitted light is slightly shifted to the longer wavelength side, that is, the green color side due to the effect of light resonance. In other words, in the color pixel corresponding to the blue color, on a side having a thin film thickness, the blue light as designed is visually recognized. On the other hand, on the side having a thick film thickness, blue light of the wavelength shifted to the green color side is visually recognized. However, as described above, the green color has the highest visual sensitivity. Accordingly, on a side having the thick film thickness, although the actual luminance becomes slightly lower than the thin side, the external luminance (light emission intensity) detected by the eyes becomes equivalent to that of the thin side.

Therefore, according to the above-described organic EL device, the acquired light emitting profile becomes fixed in the external view for the color pixel corresponding to the blue color. Accordingly, the above-described organic EL device has superior characteristics with unevenness of light emission decreased for the blue color pixel.

In the above-described organic EL device, it is preferable that the organic EL elements configure color pixels that implement light emission corresponding to at least the blue color and the red color, and the color pixel corresponding to the red color has a film thickness profile of the functional layer in a convex shape in which the center portion is relatively thick, and the periphery portion is relatively thin or a concave shape in which the center portion is relatively thin, and the periphery portion is relatively thick, and the film thickness R(a) of the center portion of the convex-shaped functional layer or the film thickness R(a) of the peripheral portion of the concave-shaped functional layer satisfies Equations (1) and (2) relating to the length d1 of the resonance light path of the optical resonator.

$$2d1 = m\lambda + (\theta an^* \lambda)/2\pi + (\theta ca^* \lambda)/2\pi \qquad \text{Equation (1)}$$

(Here, m is an integer, λ is a peak wavelength of the spectrum of light desired to be emitted, θan is the amount of phase shift in the case of reflection from the anode side, and θca is the amount of phase shift in the case of reflection from the cathode side.)

$$0.9d1 \leq R(a) \leq 1.1d1 \qquad \text{Equation (2)}$$

In such a case, the light emission profile acquired as described above is fixed in the external view for one of a color pixel corresponding to the blue color and a color pixel corresponding to the red color, and accordingly, superior light emission characteristics in which uneven light emission is decreased can be acquired.

In addition, in the above-described organic EL device, it is preferable that the functional layer is formed by using a liquid droplet ejecting method.

In such a case, by forming the functional layer by using the liquid droplet ejecting method, the film shape (the film-thickness profile) of the functional layer such as the convex shape or the concave shape can be easily controlled with excellent reproducibility.

According to a third aspect of the invention, there is provided an electronic apparatus including the above-described organic EL device.

According to the above-described electronic apparatus, the organic EL device having superior light emitting characteristics with unevenness of light emission decreased is included for the color pixel of the red color or the blue color. As a result, the electronic apparatus having a superior display capability can be acquired.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
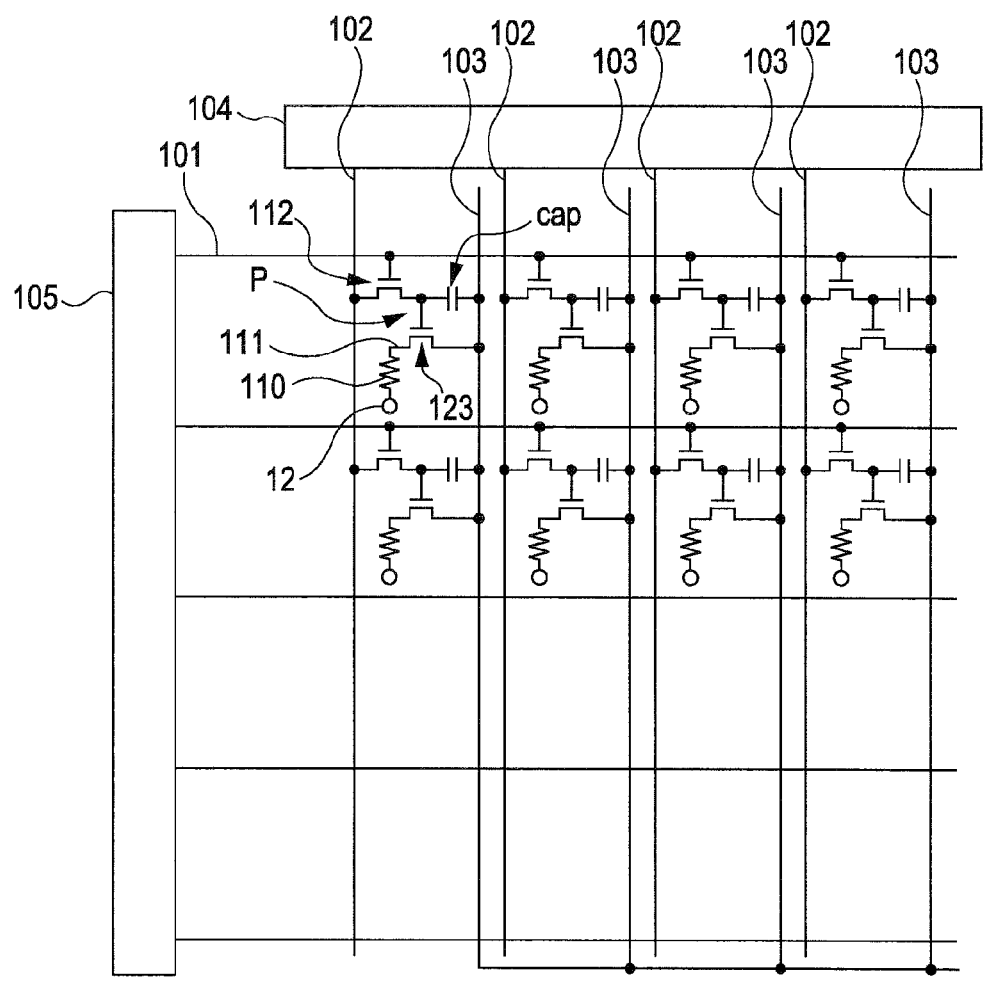
FIG. 1 is a circuit diagram showing an organic EL device according to an embodiment of the invention.

Hereinafter, an organic EL device (organic electroluminescence device) according to an embodiment of the invention will be described in detail with reference to the accompanying drawings. In the following drawings, in order to allow each layer or member to be recognizable in the drawings, the scale is appropriately changed for each layer or member.

Figure 2:
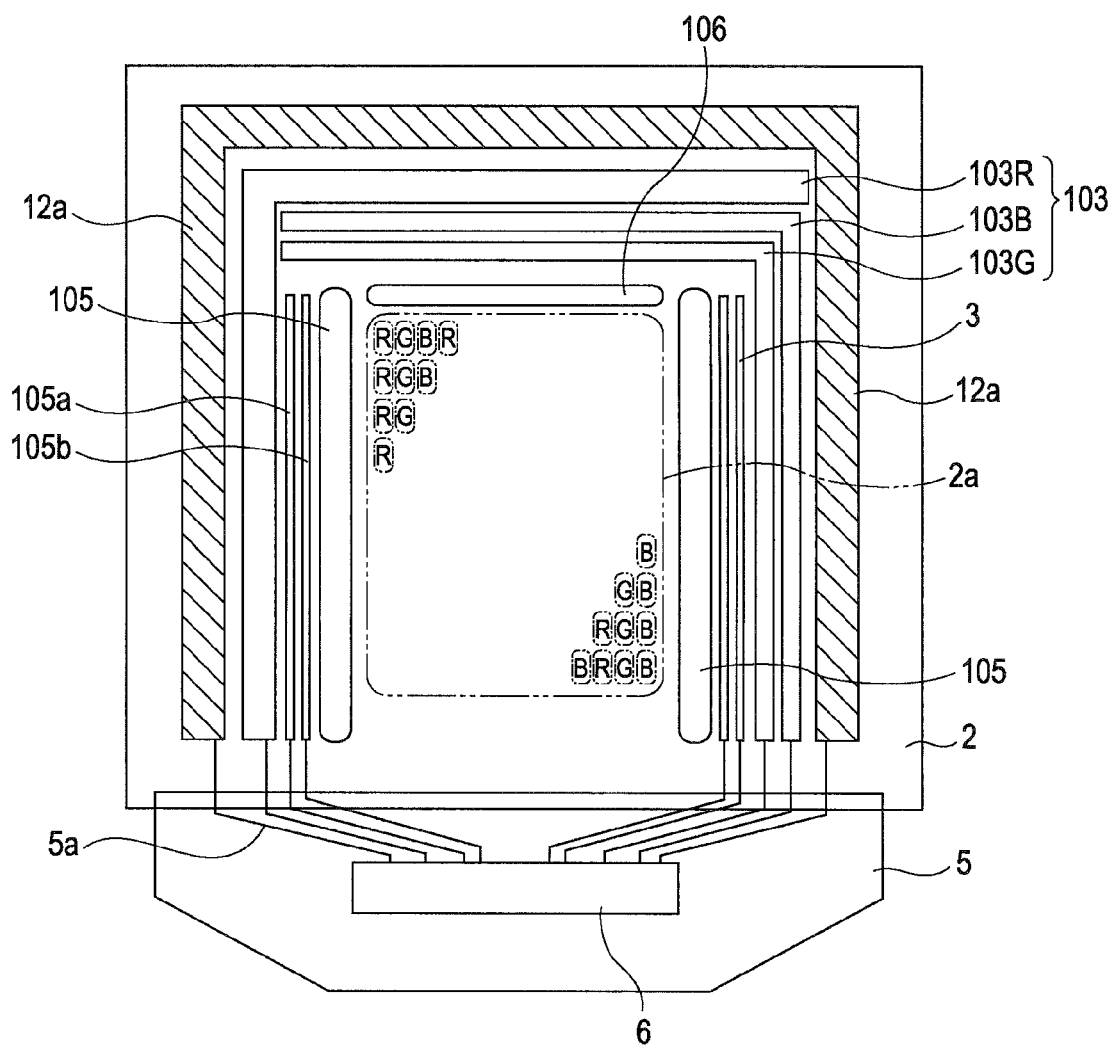
FIG. 2 is a schematic plan view of the organic EL device show in FIG. 1.
Figure 3:
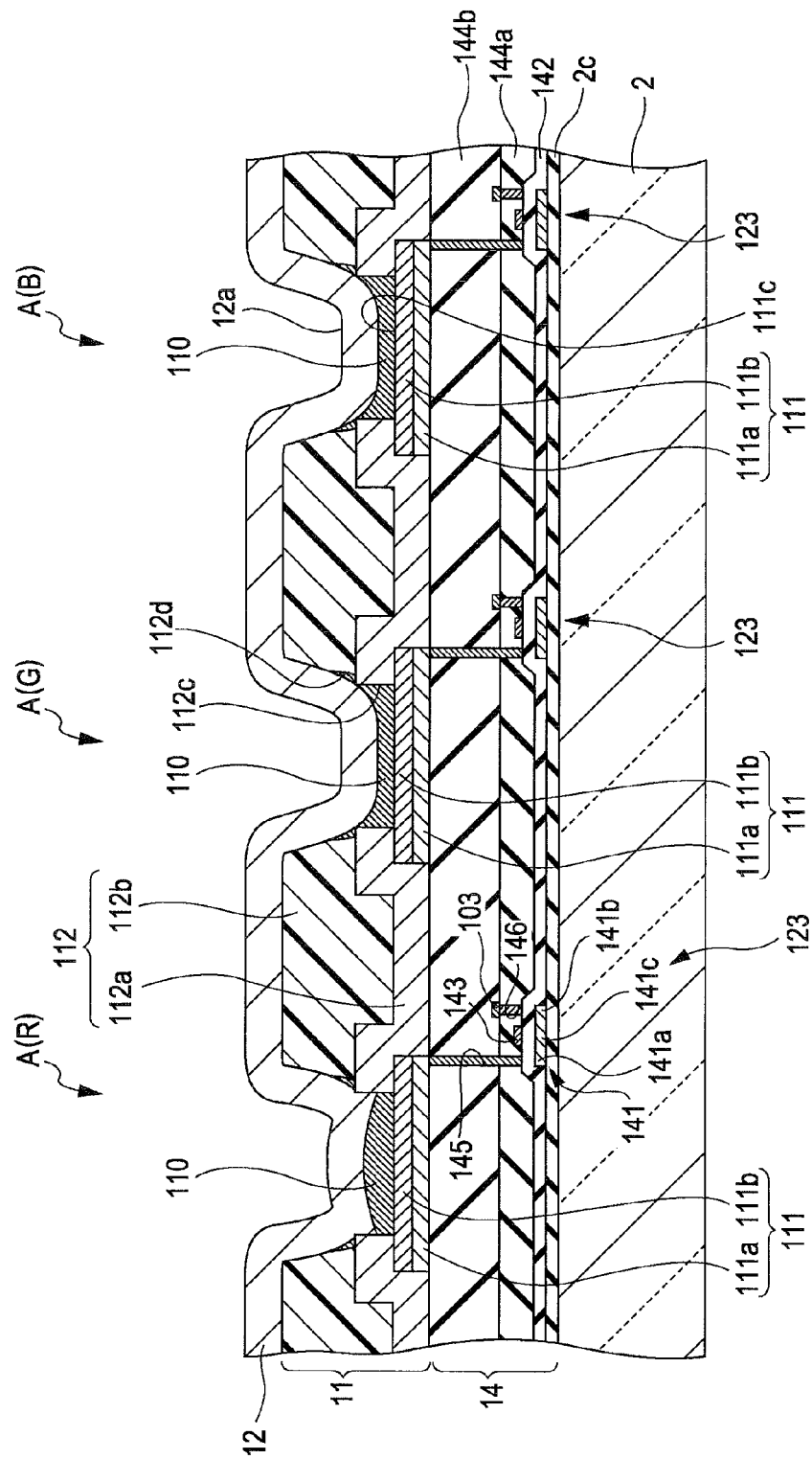
FIG. 3 is a schematic diagram showing a cross-sectional side of a display area of the organic EL device shown in FIG. 1.

FIG. 1 is an explanatory diagram showing the wiring structure of an organic EL device according to an embodiment of the invention. FIG. 2 is a schematic plan view of the organic EL device according to this embodiment. FIG. 3 is a schematic diagram showing a cross-sectional side of a display area of the organic EL device according to this embodiment.

As shown in FIG. 1, the organic EL device according to this embodiment has a configuration in which a plurality of scanning lines 101, a plurality of signal lines 102 that extends in the direction intersecting the scanning lines 101, and a plurality of power lines 103 that extends in the direction parallel to the signal lines 102 are wired. In addition, near each intersection of the scanning lines 101 and the signal lines 102, a pixel area P is arranged.

To the signal line 102, a data-side driving circuit 104 that includes a shift register, a level shifter, a video line, and an analog switch is connected. In addition, to the scanning line 101, a scanning-side driving circuit 105 that includes a shift register and a level shifter is connected.

In addition, in each pixel area P, a switching thin film transistor 122 having a gate electrode to which a scanning signal is supplied through the scanning line 101, a holding capacitor cap that maintains a pixel signal that is supplied from the signal line 102 through the switching thin film transistor 122, a driving thin film transistor 123 having the gate electrode to which the pixel signal maintained by the holding capacitor cap is supplied, a pixel electrode (anode) 111 in which a driving current flows from a power line 103 when the pixel electrode 111 is electrically connected to the power line 103 through the driving thin film transistor 123, and a functional layer 110 that is pinched between the pixel electrode 111 and a cathode (opposing electrode) 12 are disposed. Here, an organic EL element that serves as a light emitting element is configured by the anode (pixel electrode) 111, the cathode (opposing electrode) 12, and the functional layer 110.

When the switching thin film transistor 122 is turned on by driving the scanning line 101, the electric potential of the signal line 102 at that moment is maintained in the holding capacitor cap, and the ON or OFF state of the driving thin film transistor 123 is determined by the state of the holding capacitor cap. Then, a current flows from the power line 103 to the pixel electrode 111 though a channel of the driving thin film transistor 123, and a current flows in the cathode 12 through the functional layer 110. The functional layer 110 emits light, based on the amount of the current flowing through it.

The organic EL device according to this embodiment is a top emission-type organic EL device. The organic EL device, as shown in FIG. 3, includes a substrate 2 and organic EL elements (light emitting elements) that are arranged in a matrix pattern. The organic EL device includes a light emitting element unit 11 that is formed on the substrate 2 and a cathode 12 that is formed on the light emitting element unit 11. Here, a display element 10 is configured by the light emitting element unit 11 and the cathode 12.

As the material of the substrate 2, glass, a resin, or the like is appropriately used. In particular, the organic EL device according to an embodiment of the invention is a top emission type, and thus light is not emitted from this substrate 2 side. Accordingly, an opaque material may be used for the substrate 2. Therefore, an opaque resin, ceramics, metal, or the like may be used. This substrate 2, as shown in FIG. 2, is partitioned by a display area 2a that is located on the center of the substrate 2 and a non-display area that is located on the peripheral edge of the substrate 2 and surrounds the display area 2a. In addition, the display area 2a is an area that is formed by organic EL elements disposed in a matrix shape.

In the non-display area, power lines 103 (103R, 103G, and 103B) are wired, and scanning-side driving circuits 105 and 105 are disposed on both sides of the display area 2a. In addition, on both sides of the scanning-side driving circuits 105 and 105, a driving circuit control signal wiring 105a and a driving circuit power wiring 105b that are connected to the scanning-side driving circuits 105 and 105 are disposed. To the upper side of the display area 2a in the figure, a test circuit 106 that tests the quality of the display device and defects thereof in the middle of the manufacturing process or at the time of shipment is disposed.

In the side sectional configuration diagram shown in FIG. 3, three pixel areas (color pixels) A(R), A(G), and A(B) are shown. In the organic EL device according to this embodiment, a circuit element portion 14 in which circuits such as TFTs are formed, a light emitting element portion 11 in which the functional layer 110 is formed, and a cathode 12 are sequentially stacked on the substrate 2. In addition, a transparent sealing layer (not shown) is disposed thereon. In addition, as described below, a reflective face is arranged in an anode (pixel electrode) 111, and the cathode 12 has a semi-transmissive reflective layer. Between the reflective face of the anode 111 and the semi-transmissive reflective layer of the cathode 12, an optical resonator is formed. The light emitted in the functional layer 110 is resonated by the optical resonator and then, is output from the cathode 12 side, that is, the transparent sealing layer side, whereby it is visually recognized by an observer.

In the circuit element portion 14, an underlying protection film 2c that is formed by a silicon dioxide film is formed on the substrate 2, and an island-shaped semiconductor film 141 that is formed from polycrystalline silicon is formed on the underlying protection film 2c. In the semiconductor film 141, a source region 141a and a drain region 141b are formed by high-density phosphorus ion implantation. In addition, a portion in which the phosphorus ions are not introduced is configured as a channel region 141c.

In addition, a transparent gate insulating film 142 that covers the underlying protection film 2c and semiconductor film 141 is formed. On the gate insulating film 142, a gate electrode 143 (scanning line 101) that is made of Al, Mo, Ta, Ti, W, or the like is formed. In addition, on the gate electrode 143 and the gate insulating film 142, a transparent first interlayer insulting film 144a and a second interlayer insulating film 144b are formed. The gate electrode 143 is disposed in a position corresponding to the channel region 141c of the semiconductor film 141. In addition, contact holes 145 and 146 that are connected to the source and drain regions 141a and 141b of the semiconductor film 141 are formed by perforating the first and second interlayer insulating films 144a and 144b.

On the second interlayer insulating film 144b, a pixel electrode (anode) 111 that is patterned in a predetermined shape is formed, and one contact hole 145 is connected to the pixel electrode 111. In addition, the other contact hole 146 is connected to the power line 103. Accordingly, in the circuit element portion 14, the driving thin film transistors 123 that are connected to each of the pixel electrode 111 are formed. As shown in FIG. 3, the driving thin film transistor 123 is disposed in a position right below a partition wall portion 112, to be described later, avoiding the position right below the pixel electrode 111. However, since the organic EL device according to an embodiment of the invention is the top-emission type, the thin film transistor 123 may be disposed in a position right below the pixel electrode 111.

The light emitting element portion 11 is configured by functional layers 110 that are stacked on a plurality of pixel electrodes (anodes) 111 and partition wall portions 112 that are included between each pixel electrode 111 and the functional layer 110 and partition the functional layers 110 as its basic bodies. In addition, on the functional layers 110 and the partition wall portions 112, the cathode 12 is disposed. The organic EL element, as described above, is configured by the pixel electrode 111, the functional layer 110, and the cathode 12.

Figure 4:
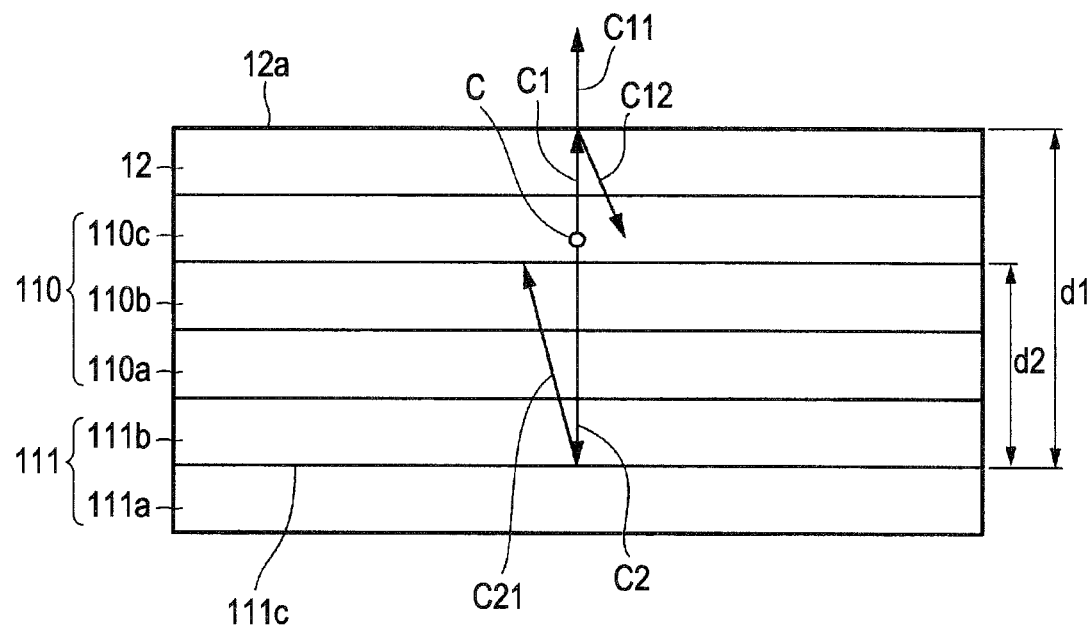
FIG. 4 is a schematic diagram showing the configuration of an optical resonator according to an embodiment of the invention.

The pixel electrode (anode) 111, as shown in FIG. 4, is formed by stacking a reflective film 111a that is, for example, formed from an alloy of Al (aluminum) and Nd (neodymium) and a transparent conductive film 111b that is formed from ITO and forming patterns in the shape of an approximate rectangle in the plan view. Here, the pixel electrode 111 is configured to reflect the light emitted in the functional layer 110 by the reflective film 111a, and this reflective film 111a is used as a reflection face. In other words, the reflective film 111a is a thin film formed to have a thickness of several nanometers to several tens of nanometers. Since the reflective film 111a transmits a small amount of light through it, not only the boundary face which is between the reflective film 111a and the transparent conductive film 111b serves as the reflective surface but also the boundary face which is located inside the reflective film 111a, that is between the reflective film 111a and the second interlayer insulating film 144b, also serves as a reflective surface for the light emitted from functional layer 110. As the reflective film 111a, for example, a single film formed of Al or a metal film formed of Ni, Cr, or the like can be used, in addition to the above-described alloy film formed from Al and Nd.

The partition wall portion 112, as shown in FIG. 3, is disposed in the form for dividing the pixel electrodes 111. The partition wall portion 112 is configured by an inorganic partition wall 112a formed on the substrate 2 side and an organic partition wall 112b formed on the inorganic partition wall 112a. The inorganic partition wall 112a is formed from SiO2 or the like, and the organic partition wall 112b is formed from an acrylic resin or the like.

The inorganic partition wall 112a is formed so as to be partly disposed on the peripheral edge of the pixel electrode 111 by forming an opening 112c that exposes the pixel electrode 111. In addition, the organic partition wall 112b is disposed so as to be partly overlapped with the peripheral edge of the pixel electrode 111 in the plan view by forming an opening 112d that is communicated with the above-described opening 112c. The inorganic partition wall 112a is formed so as to extend to the center of the pixel electrode 111 relative to the edge of the organic partition wall 112b. Accordingly, the opening 112d of the organic partition wall 112b is formed to be slightly broader than the opening 112c of the inorganic partition wall 112a.

In the partition wall portion 112 that is configured by the inorganic partition wall 112a and the organic partition wall 112b, areas showing lyophilicity and areas showing liquid-repellency are formed. The areas showing lyophilicity are the inorganic partition wall 112a and the exposed surface (a surface that is exposed to the inside of the opening 112b) of the pixel electrode 111. The lyophilic areas are formed by performing a lyophilic treatment through a plasma treatment using oxygen as the treatment gas. On the other hand, the areas showing liquid-repellency are the face of the opening portion 112d and the upper face of the organic partition wall 112. The liquid-repellent areas are formed by performing a fluorination treatment (liquid-repellent treatment) through a plasma treatment using tetrafluoro methane (carbon tetrafluororide) as the treatment gas.

The functional layer 110, as shown in FIG. 4, is configured by a hole injection layer 110a that is disposed on the pixel electrode 111, a hole transport layer 110b that is disposed on the hole injection layer 110a, and a light emitting layer 110c that is disposed on the hole transport layer 110b.

The hole injection layer 110a additionally injects holes that are injected from the pixel electrode (anode) 111 to the hole transport layer 110b side. In this embodiment, the hole injection layer 110a is formed from PEDOT-PSS. In other words, this hole injection layer 110a is formed by ejecting and drying a dispersion medium that is acquired by dispersing a dispersion liquid of 3,4-polyethylenedioxythiophene-polystyrenesulfonic acid (PEDOT-PSS); that is, a dispersion medium acquired by dispersing 3,4-polyethylenedioxythiophene into polystyrenesulfonic acid serving as a dispersion medium and additionally dispersing the resultant liquid into water on the pixel electrode 111 by using an ink jet method (liquid droplet ejecting method).

The hole transport layer 110b transports holes that are injected from the hole injection layer 110a to the light emitting layer 110c side. In this embodiment, the hole transport layer 110b is formed form TFB(poly(2,7-(9,9-di-n-octylfluorene)-alt-(1,4-phenylene-((4-sec-butylphenyl) imino-1,4-phenylene))). In other words, this hole transport layer 110b, for example, is formed by ejecting and drying a prepared tri-methyl benzene liquid having TFB of 0.1 wt % by using an ink jet method (liquid droplet ejecting method) on the hole injection layer 110a.

The light emitting layer 110c is formed on the hole transport layer 110b. The light emitting layer 110c achieves light emission by recombining the holes transported from the hole transport layer 110b and electrons transported from the cathode 12. This light emitting layer 110c is formed from a red light emitting material in the color pixel (pixel area) A(R) that performs light emission corresponding to the red color shown in FIG. 3. Similarly, the light emitting layer 110c is formed from a green light emitting material in the color pixel (pixel area) A(G) that performs light emission corresponding to the green color and is formed from a blue light emitting material in the color pixel (pixel area) A(B) that performs light emission corresponding to the blue color.

In particular, in this embodiment, as the red light emitting material, Poly[{2-methoxy-5-(2-ethylhexyloxy)-1,4-(1-cyanovinylenephenylene)}-co-{2,5-bis(N,N'-diphenylamino)-1,4-phenylene}] having an emission wavelength (λ) of 630 nm is used. Then, the red light emitting material is dissolved into an appropriate solvent to be in liquid-form, and the liquid-form material is ejected and dried on the hole transport layer 110b by using the ink jet method (liquid droplet ejecting method), whereby the light emitting layer (red light emitting layer) 110c of the color pixel (pixel area) A(R) that performs light emission corresponding to the red color is formed.

In addition, as the green light emitting material, Poly[(9,9-dioctylfluorenyl-2,7-diyl)-co-(1,4-benzo-(2,1',3)-thiadiazole)] having the emission wavelength (λ) of 530 nm is used. As the blue light emitting material, Poly[(9,9-dihexylfluorenyl-2,7-diyl)-co-(9,10-anthracene)] having the emission wavelength (λ) of 440 nm is used. Then, the green light emitting material or the blue light emitting material is dissolved in an appropriate solvent to be in liquid-form, and the liquid-form material is ejected and dried on the hole transport layer 110b by using the ink jet method (liquid droplet ejecting method), whereby the light emitting layer (green light emitting layer) 110c of the color pixel (pixel area) A(G) that performs light emission corresponding to the green color or the light emitting layer (blue light emitting layer) 1210c of the color pixel (pixel area) A(B) that performs light emission corresponding to the blue color is formed.

The cathode 12 is formed so as to cover the light emitting layer 110c (functional layer 110) on the entire face of the light emitting portion 11. The cathode 12 has a function for injecting electrons to the light emitting layer 110c. According to this embodiment, this cathode 12 is formed of LiF (lithium fluoride), which has a thickness of about 5 nm, formed by using a vacuum deposition method and a stacked film, which has a thickness of about 10 nm, formed from MgAg by using a co-evaporation method. In addition, as the material of the cathode 12, a conductive material such as Ca or Ba that has the characteristics of an electron injection be used, in addition to the above-described materials.

These conductive materials exhibit transparency by being formed to be sufficiently thin. However, the conductive materials actually have semi-transmissive reflectivity from which the light is reflected to some degree. Thus, actually, the formed cathode 12 does not serve as a layer that transmits the entire incident light but serves as a reflective layer that reflects a part of the incident light. In addition, in such a configuration, the optical resonator described above is formed between the cathode 12 that is a semi-transmissive reflective layer and the reflective face of the anode (pixel electrode) 111.

Here, in this embodiment, as shown in FIG. 4, in the anode (pixel electrode) 111 that is formed by the reflective film 111a and the transparent conductive film 111b, the boundary face between the reflective film 111a and the transparent conductive film 111b is configured as the reflective face 111c. In addition, in the cathode 12 that is a semi-transmissive reflective layer, the boundary face of the cathode 12 and a sealing layer not shown in the figure is configured as a semi-transmissive reflective face 12a. Thus, the above-described optical resonator is formed between the reflective face 111c and the semi-transmissive reflective face 12a.

In such a structure of the optical resonator, light C generated by the light emitting layer 110c of the functional layer 110 is divided into light C1 that travels toward the cathode 12 side and light C2 that travels toward the anode side, and a part C11 of the light C1 traveling toward the cathode 12 side is transmitted through the semi-transmissive reflective face 12a so as to be output to the sealing layer side. Accordingly, the outgoing light C11 is visually recognized by an observer.

In addition, the remaining light C12 of the light C1 traveling to the cathode 12 side is reflected from the semi-transmissive reflective face 12a and travels to the anode 111 side.

On the other hand, the light C2 traveling toward the anode side is reflected totally from the reflective face 111c so as to be light C21 traveling toward the cathode 12 side. Then, in the light emitting layer 110c, the light C generated in the light emitting layer 110c, the light C12 reflected from the semi-transmissive reflective face 12a, and the light C21 reflected from the reflective face 111c are resonated. Such resonance of light is amplified by repeating the reflection from the semi-transmissive reflective face 12a and reflection from the reflective face 111c several times, and then, the light is transmitted through the semi-transmissive reflective face 12a so as to be output as light C11. In other words, the outgoing light C11 that is visually recognized by an observer is output as a total of the light C11 that is directly transmitted through the semi-transmissive reflective face 12a after being emitted in the light emitting layer 110c and the light C11 that is amplified owing to the effect of the optical resonance as described above.

The light C11 that is output after being resonated has the maximum transmittance (output ratio) in a case where the length d1 of the resonance light path satisfies the following Equation (1), whereby light of a desired wavelength as designed is acquired.

$$2d_1 = m\lambda + (\theta_{an} * \lambda)/2\pi + (\theta_{ca} * \lambda)/2\pi \qquad \text{Equation (1)}$$

(Here, m is an integer, λ is a peak wavelength of the spectrum of light desired to be emitted, θan is the amount of phase shift in the case of reflection from the anode side, and θca is the amount of phase shift in the case of reflection from the cathode side.)

In addition, λ becomes 630 nm, which is the emission wavelength (λ) of the red light emitting material, in the red light emitting layer 110c of the color pixel that achieves light emission corresponding to the red color. Similarly, λ becomes 530 nm, which is the emission wavelength (λ) of the green light emitting material, in the green light emitting layer 110c, and λ becomes 440 nm, which is the emission wavelength (λ) of the blue light emitting material, in the blue light emitting layer 110c.

The length d1 of the resonance light path is defined by a distance between the reflective face 111c and the semi-transmissive reflective face 12a. Since the reflective film 111a and the transparent conductive film 111b that configure the anode 111 and the cathode 12 are formed by using a deposition method that is a gas-phase method, there is little deviation in the thickness. Accordingly, the thickness of the anode 111 or the cathode 12 is uniform within each color pixel. On the other hand, the functional layer 110, as described above, is formed by using the ink jet method (liquid droplet ejecting method) that is a liquid-phase method, unevenness of the film thickness occurs in each color pixel. In addition, as described above, it is still difficult to eliminate the unevenness of the film thickness so as to flatten the film.

Figure 5A:
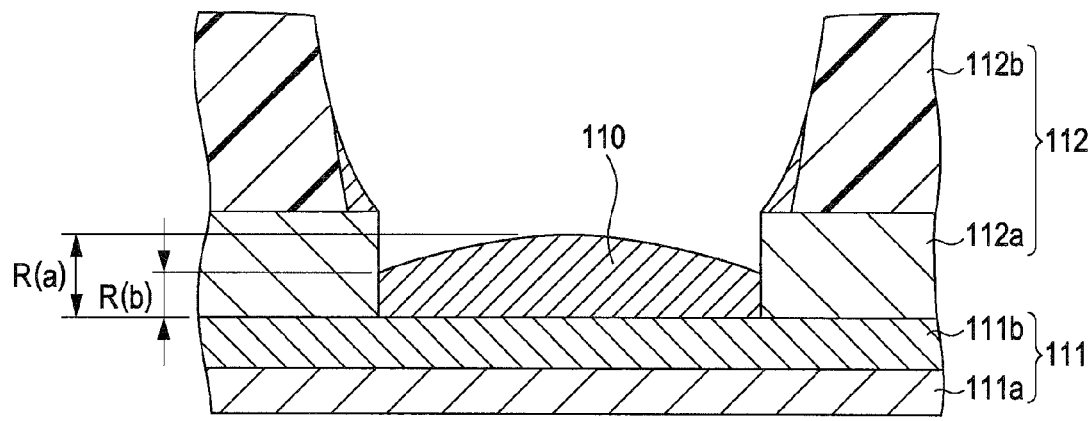
FIG. 5A is a film thickness profile of a functional layer.

In this embodiment, particularly in the color pixel (red pixel) that implements light emission corresponding to the red color, the profile of the film thickness of the functional layer 110, as shown in FIG. 5A, is formed so as to be in a convex shape in which the film thickness R(a) of the center portion is relatively thick, and the film thickness R(b) of the periphery portion is relatively thin. In addition, the film thickness R(a) of the functional layer 110 in the center portion is formed so as to satisfy the above-described Equation (1) and Equation (2) represented below. In other words, the film thickness R(a) is designed such that the length d1 of the resonance light path that is defined as a distance between the reflective face 111c and the semi-transmissive reflective face 12a shown in FIG. 4 satisfies both Equations (1) and (2), and the functional layer 110 is formed as designed.

$$0.9(d1) \leq R(a) \leq 1.1(d1) \qquad \text{Equation (2)}$$

Here, as shown in an experimental example to be described later, the current efficiency is almost constant when the actual film thickness R(a) is within the ±10% range of the ideal length d1 of the resonance light path. Accordingly, according to an embodiment of the invention, as shown in Equation (2), the film thickness R(a) is configured to be within the ±10% range of the ideal length d1 of the resonance light path. However, as a range for implementing more constant current efficiency, it is preferable that the actual film thickness R(a) is configured to be within ±5% range of the ideal length d1 of the resonance light path. Thus, it is preferable that the following equation is used instead of the above-described Equation (2).

$$0.95(d1) \leq R(a) \leq 1.05(d1)$$

In addition, the thicknesses of the anode 111 or the cathode 12 are uniform as described above. Since the thicknesses thereof are more important factors for the design of an organic EL element, the thicknesses are designed and determined with priority. Accordingly, a variable determining the length d1 of the resonance light path that is shown in the above-described Equation (1) is the film thickness of the functional layer 110. In other words, by defining the film thickness of the functional layer 110, the length d1 of the resonance light path is substantially defined.

Here, as a method of forming the film thickness profile for the convex shape, there are various techniques such as a method of controlling the viscosity of the a liquid-phase material (functional layer forming material), a method of controlling a drying process, or a method of adjusting the property (liquid-repellency or lyophilicity) or the shape and the size of the partition wall portion 112 (for example, see JP-A-2006-12762). Thus, by appropriately using these techniques, the film thickness profile for the desired convex shape can be formed. Similarly, the film thickness profile for a concave shape to be described later can be formed by using the above-described techniques.

Figure 6A:
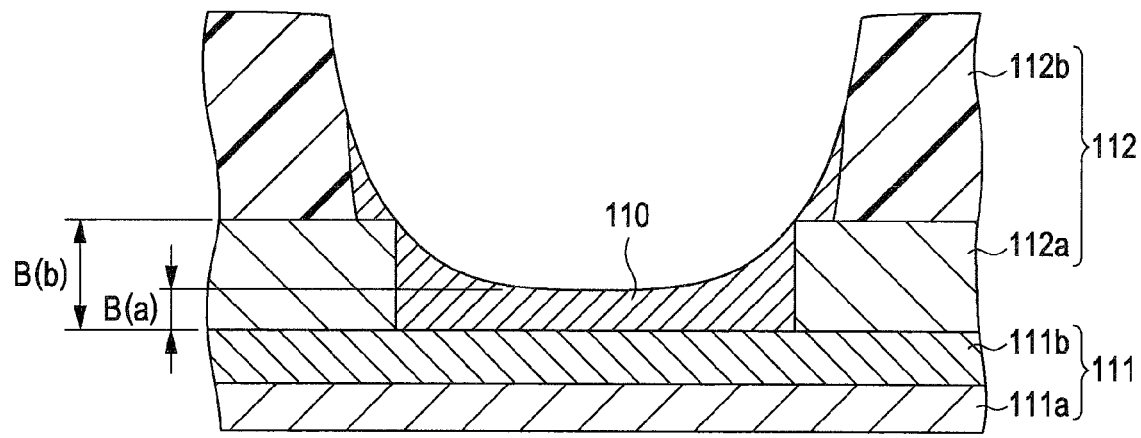
FIG. 6A is a film thickness profile of a functional layer.

In addition, in a color pixel (blue pixel) that implements light emission corresponding to the blue color, the film thickness profile of the functional layer 110, as shown in FIG. 6A, is formed in a concave shape in which the film thickness B(a) of the center portion is relatively thin, and the film thickness B(b) of the periphery portion is relatively thick. In addition, the film thickness B(a) of the functional layer 110 in the center portion, similarly to the above-described case of the red pixel, is formed so as to simultaneously satisfy the above-described Equation (1) and the following Equation (3).

$$0.9(d1) \leq B(a) \leq 1.1(d1) \qquad \text{Equation (3)}$$

Here, the reason why the film thickness B(a) is formed so as to satisfy Equation (3) is the same for the case of the film thickness R(a). However, as a range for implementing a more constant current efficiency, it is preferable that the actual film thickness B(a) is configured to be within ±5% range of the ideal length d1 of the resonance light path. Thus, it is preferable that the following equation is used instead of the above-described Equation (3).

$$0.95(d1) \leq B(a) \leq 1.05(d1)$$

Figure 7A:
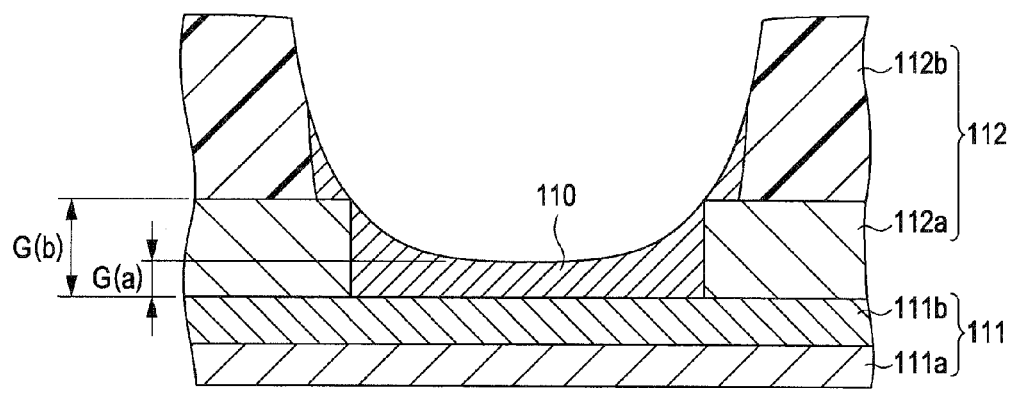
FIG. 7A is a film thickness profile of a functional layer.

In addition, in a color pixel (green pixel) that implements light emission corresponding to the green color, although not particularly limited, similarly to the case of the blue pixel, the film thickness profile of the functional layer 110, as shown in FIG. 7A, is formed in a concave shape in which the film thickness G(a) of the center portion is relatively thin, and the film thickness G(b) of the periphery portion is relatively thick in this embodiment. In addition, the film thickness G(a) of the functional layer 110 in the center portion, similarly to the above-described case of the blue pixel, is formed so as to satisfy both the above-described Equation (1) and the following Equation (4).

$$0.9d1 \leq G(a) \leq 1.1d1 \qquad \text{Equation (4)}$$

Here, the reason why the film thickness G(a) is formed so as to satisfy Equation (4) is the same for the case of the film thickness R(a). However, as a range for implementing the more constant current efficiency, it is preferable that the actual film thickness B(a) is configured to be within ±5% range of the ideal length d1 of the resonance light path. Thus, it is preferable that the following equation is used instead of the above-described Equation (4).

$$0.95(d1) \leq G(a) \leq 1.05(d1)$$

In each color pixel having the functional layer 110 that is formed in accordance with such a film thickness profile, particularly in the red pixel and the blue pixel, the unevenness of the light emission is reduced sufficiently.

In other words, in the red pixel, the blue pixel, and the green pixel, the film thickness R(a), B(a), and G(a) of the center portion of the functional layer 110 satisfies Equation (1) relating to the length d1 of the resonance light path in the above-described optical resonator and Equation (2), (3), or (4). Accordingly, in the portion corresponding to the film thickness R(a), B(a), or G(a) of the center portion, the light transmittance (output ratio) is almost the maximum owing to the effect of light resonance. In addition, since the film thicknesses R(a), B(a) and G(a) are set such that any one of the above-described Equations (1), (2), (3), and (4) is satisfied, light of the desired wavelength range that has been set is emitted in the portions corresponding to of the film thicknesses R(a), B(a), and G(a). Accordingly, red light, blue light, and green light having desired wavelengths as designed are acquired.

In addition, particularly in the red pixel, since the film thickness profile of the functional layer 110 is formed in a convex shape, the film thickness of the periphery portion (a portion of the film thickness R(b)) is relatively small so as to decrease the light transmittance (output ratio) in the periphery portion, compared to the center portion (a portion of the film thickness R(a)) in which almost the maximum light transmittance (output ratio) is acquired owing to the effect of light resonance.

Figure 5B:
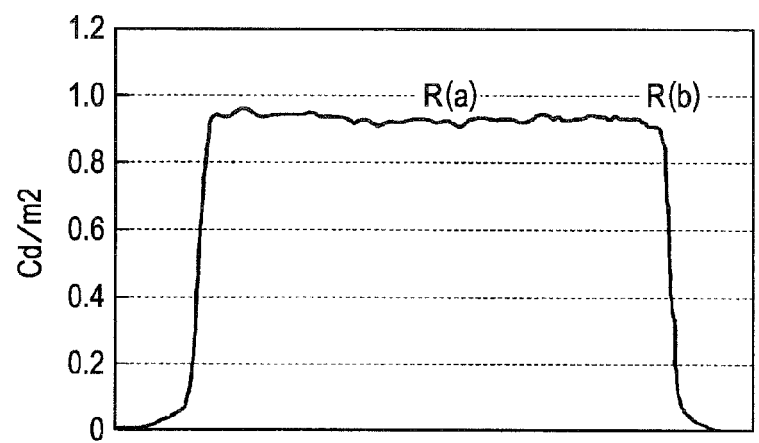
FIG. 5B is a light emission profile.
Figure 6B:
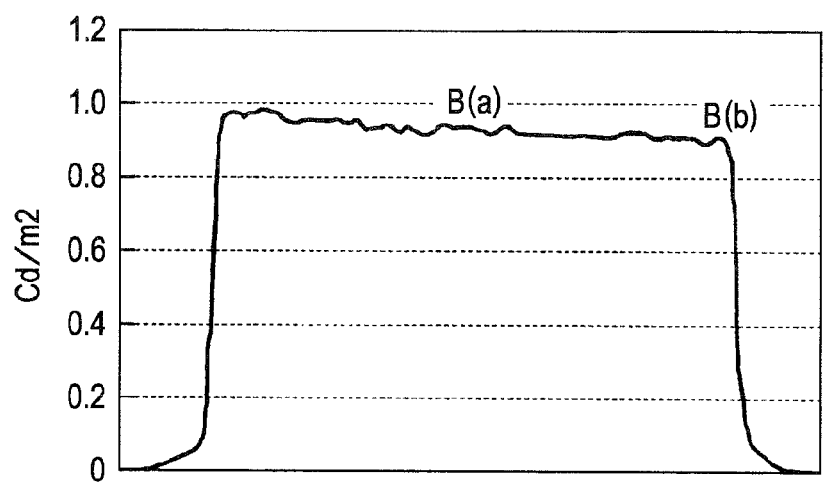
FIG. 6B is a light emission profile.
Figure 7B:
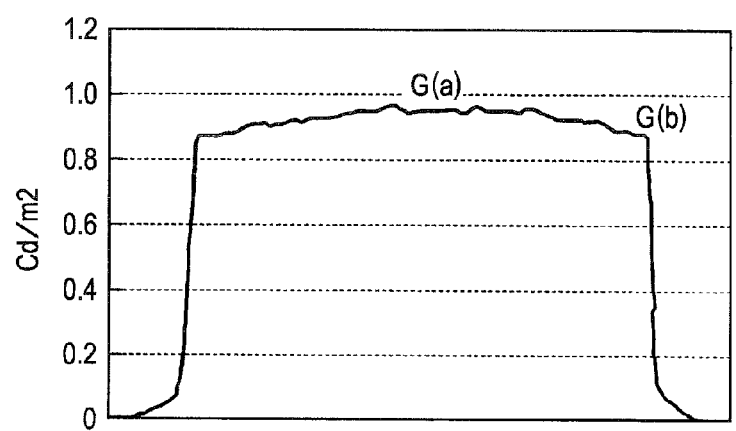
FIG. 7B is a light emission profile.

While the light transmittance is decreased in the periphery portion as described above, the wavelength of emitted light is slightly shifted to the shorter wavelength side, that is, the green color side due to the effect of the light resonance. In other words, in a color pixel corresponding to the red color, while red light of the wavelength as designed is visually recognized in the center potion, red light of a wavelength that is shifted to the green color side is visually recognized in the periphery portion. However, the green color has the highest visual sensitivity as described above. Thus, even when the actual luminance of the periphery portion becomes slightly lower than that of the center portion, the external luminance (light emitting intensity) of the periphery portion detected by the eyes is equivalent to that of the center portion, as shown in the light emitting profile of FIG. 5B. Accordingly, the emitted light is almost uniform in the entirety of the red pixel. Here, FIG. 5B, and FIGS. 6B and 7B to be described later are graphs representing light emission profiles in which the horizontal axis extends in the diameter direction of the functional film 110, and the vertical axis represents the external luminance (light emitting intensity) detected by the eyes.

In addition, particularly in the blue pixel, since the film thickness profile of the functional layer 110 is formed in a concave shape, the film thickness of the periphery portion (a portion of the film thickness B(b)) is relatively large so as to decrease the light transmittance (output ratio) in the periphery portion, compared to the center portion (a portion of the film thickness B(a)) in which almost the maximum light transmittance (output ratio) is acquired owing to the effect of light resonance.

While the light transmittance is decreased in the periphery portion as described above, the wavelength of emitted light is slightly shifted to the longer wavelength side, that is, the green color side due to the effect of the light resonance. In other words, in a color pixel corresponding to the blue color, while blue light of the wavelength as designed is visually recognized in the center potion, blue light of a wavelength that is shifted to the green color side is visually recognized in the periphery portion. However, the green color has the highest visual sensitivity as described above. Thus, even when the actual luminance of the periphery portion becomes slightly lower than that of the center portion, the external luminance (light emitting intensity) of the periphery portion detected by the eyes is equivalent to that of the center portion, as shown in the light emitting profile of FIG. 6B. Accordingly, the emitted light is almost uniform in the entirety of the blue pixel.

In addition, particularly in the green pixel, since the film thickness profile of the functional layer 110 is formed in a concave shape, the film thickness of the periphery portion (a portion of the film thickness G(b)) is relatively large so as to decrease the light transmittance (output ratio) in the periphery portion, compared to the center portion (a portion of the film thickness G(a)) in which almost the maximum light transmittance (output ratio) is acquired owing to the effect of light resonance.

While the light transmittance is decreased in the periphery portion as described above, the wavelength of emitted light is slightly shifted to the longer wavelength side due to the effect of the light resonance. Here, in this embodiment, as a green light emitting material, a material that has the emission wavelength ($\lambda$) of 530 nm is used. Accordingly, a wavelength that is slightly shorter than 550 nm that is the center wavelength of the green light is configured to be emitted from the center portion (a portion of the film thickness G(a)). Therefore, the film thickness is relatively small so as to shorten the length d1 of the resonance light path in the peripheral portion (a portion of the film thickness G(b)), and the wavelength of the outgoing light is shifted to the longer wavelength side as that much, whereby the wavelength of the emitted light is close to 550 nm that is the center wavelength of the green color in the periphery portion. Thus, even when the actual luminance of the periphery portion becomes slightly lower than that of the center portion, the external luminance (light emitting intensity) of the periphery portion detected by the eyes is equivalent to that of the center portion, as shown in the light emitting profile of FIG. 7B. Accordingly, the emitted light is almost uniform in the entirety of the green pixel.

In addition, in this embodiment, in the structure of the optical resonance shown in FIG. 4, particularly, it is preferable that the length d2 of the interference light path for the light C2, traveling toward the anode 111 side, out of the light C generated in the light emitting layer 110c satisfies the following Equation (5). When the length of the interference light path d2 satisfies Equation (5) as described above, the luminance (light emission intensity) of the light emitted from each pixel becomes higher.

$$2d2m\lambda + (\theta an^* \lambda)/2\pi \quad \text{Equation (5)}$$

(Here, m is an integer, $\lambda$ is a peak wavelength of the spectrum of light desired to be emitted, and $\theta$an is the amount of phase shift in the case of reflection from the anode side.)

In addition, $\lambda$ represents the same as in Equation (1).

Here, the "interference" represents interference generated between the light C21, traveling toward the cathode 12 side, that is acquired by the total reflection of the light C2 traveling toward the anode 111 side out of the light C generated in the light emitting layer 110c from the reflective face 111c and the light C1 traveling toward the cathode 12 side out of the light C generated in the light emitting layer 110c.

The length d2 of the interference light path is defined by a distance between a light emitting spot (light emitting face) of the light emitting layer 110c and the reflective face 111c. For example, the light emitting spot (light emitting face) of the light emitting layer 110c can be designed as the boundary surface between the light emitting layer 110c and the hole transport layer 110b. Then, a variable for the length d2 of the interference light path in the above-described Equation (2) is a sum of thicknesses of the hole injection layer 110a and the hole transport layer 110b. In other words, by defining the sum of the thicknesses, the length d2 of the interference light path is defined. Here, for example, the sum of the thicknesses of the hole injection layer 110a and the hole transport layer 110b may be represented by the thickness of the center portion corresponding to the above-described film thickness R(a), B(a) or G(a). Alternatively, in another embodiment of the invention to be described later, the sum of the thicknesses of the hole injection layer 110a and the hole transport layer 110b may be represented by the thickness of the periphery portion corresponding to the film thickness R(a) or B(a).

Accordingly, as described above, by forming each layer such that the length d1 of the resonance light path satisfied Equation (1) based on the entire film thickness of the functional layer 110, the film thicknesses R(a), B(a), and G(a) satisfy corresponding Equations (2), (3) and (4), and the length d2 of the interference light path satisfies Equation (2) based on the sum of the thicknesses of the hole injection layer 110a and the hole transport layer 110b, the luminance of light emitted from each color pixel in the organic EL device of this embodiment becomes the most preferable.

In addition, on the cathode 12 that configures the above-described organic EL element (light emitting element), a protection layer formed from an inorganic material such as silicon dioxide, silicon nitride, or oxidized silicon nitride is formed, and the sealing layer formed from a transparent resin such as an epoxy resin is formed. As a result, the organic EL device having the top-emission structure that emits light from the transparent sealing layer side is configured.

In the organic EL device having the above-described configuration, in the red pixel, the blue pixel, and the green pixel, the film thicknesses R(a), B(a), and G(a) of the center portions of the functional layers 110 are set so as to satisfy Equation (1) relating to the length d1 of the resonance light path of the above-described optical resonator and any one of Equations (2), (3), and (4). Accordingly, the transmittance (output ratio) of light in the center portions becomes almost the maximum due to the effect of light resonance. In addition, since the film thicknesses R(a), B(a), and G(a) are set to satisfy any one of the above-described Equations (1), (2), (3), and (4), light of a desired wavelength range that has been set is emitted in the portions of the film thicknesses R(a), B(a), and G(a), whereby red light, blue light, and green light of desired wavelengths as designed are acquired.

In addition, the film thickness profile of the functional layer 110 is formed in the convex shape in the red pixel. On the other hand, the film thickness profiles of the functional layers 110 are formed in the concave shape in the blue pixel and the green pixel. Accordingly, the light transmittance is low in all the periphery portions. However, in the periphery portions, the wavelength of the emitted light is shifted to the green color side due to the effect of the light resonance. As a result, the external luminance (light emission intensity) of the periphery portions that is detected by the eyes becomes equivalent to that of the center portion, and whereby almost uniform luminance is acquired from the entirety of the color pixels.

Accordingly, in this organic EL device, the light emission profiles acquired for the red pixel, the blue pixel, and the green pixel are externally observed to be fixed. In addition, the organic EL device has superior light emitting characteristics for which unevenness of light emission is reduced for any of the color pixels.

Next, an organic EL device according to another embodiment of the invention will be described.

Figure 8A:
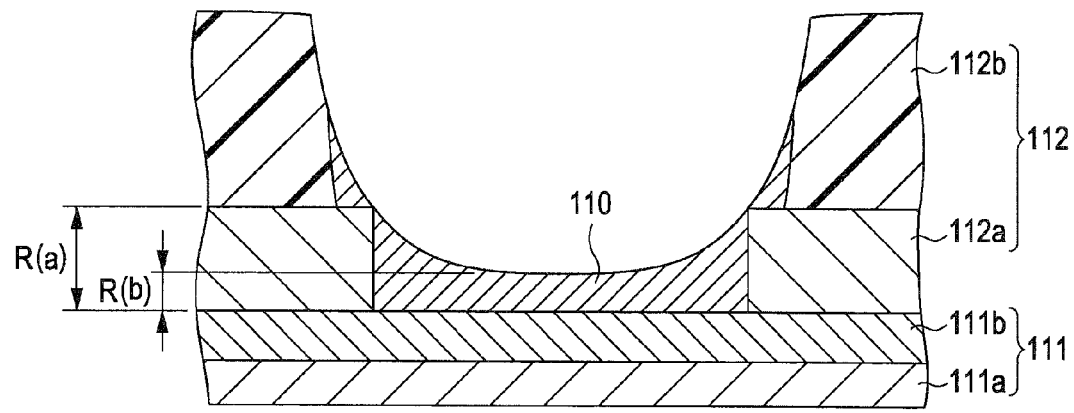
FIG. 8A is a film thickness profile of a functional layer.

A difference between the above-described embodiment and this embodiment is that, in the color pixel (red pixel) implementing light emission corresponding to the red color, the film thickness profile of the functional layer 110 is formed to be in a concave shape as shown in FIG. 8A, in which the film thickness R(b) is relatively thin, and the film thickness of the periphery portion R(a) is relatively thick in this embodiment. In addition, the film thickness R(a) of the periphery portion of the functional layer 110 is formed so as to satisfy the above-described Equation (1) and Equation (2) represented below. In other words, the film thickness R(a) is designed such that the length d1 of the resonance light path defined by the reflective face 111c and the semi-transmissive reflective face 12a shown in FIG. 4 satisfies both Equations (1) and (2), and the functional layer 110 is formed as designed.

$$0.9(d1) \leq R(a) \leq 1.1(d1) \qquad \text{Equation (2)}$$

Figure 9A:
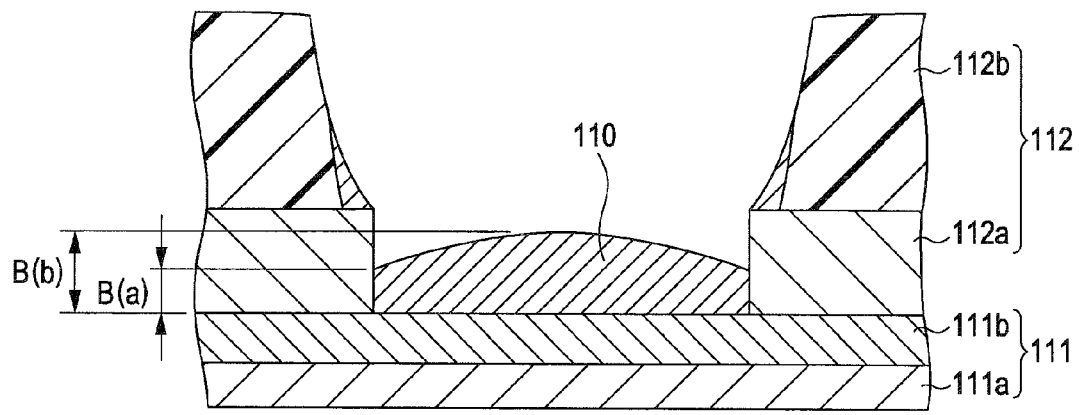
FIG. 9A is a film thickness profile of a functional layer.

In addition, in the color pixel (blue pixel) that implements light emission corresponding to the blue color, the film thickness profile of the functional layer 110, as shown in FIG. 9A, is formed in a convex shape in which the film thickness B(b) of the center portion is relatively thick, and the film thickness B(a) of the periphery portion is relatively thin. The film thickness B(a) of the periphery portion of the functional layer 110, same as in the above-described red pixel, is formed so as to satisfy the above-described Equation (1), and the following Equation (3).

$$0.9(d1) \leq B(a) \leq 1.1(d1) \qquad \text{Equation (3)}$$

In addition, as a range in which the current efficiency becomes more constant, it is preferable that also the film thickness R(a) and the film thickness B(a) are configured to be in ±5% range of the ideal length d1 of the resonance light path. Accordingly, in such a case, it is preferable that the following equations are used instead of the above-described Equations (2) and (3).

$$0.95(d1) \leq R(a) \leq 1.05(d1)$$

$$0.95(d1) \leq B(a) \leq 1.05(d1)$$

In the organic EL device having such a configuration, in the red pixel and the blue pixel, the film thicknesses R(a) and B(a) of the periphery portions of the functional layer 110 are set so as to satisfy Equation (1) relating to the length d1 of the resonance light path of the above-described optical resonator and any one of Equations (2) and (3). Accordingly, the transmittance (output ratio) of light in the periphery portions becomes almost the maximum due to the effect of light resonance. In addition, since the film thicknesses R(a) and B(a) are set to satisfy any one of the above-described Equations (1), (2), and (3), light of a desired wavelength range that has been set is emitted in the portions of the film thicknesses R(a) and B(a), whereby red light and blue light of desired wavelengths as designed are acquired.

Figure 8B:
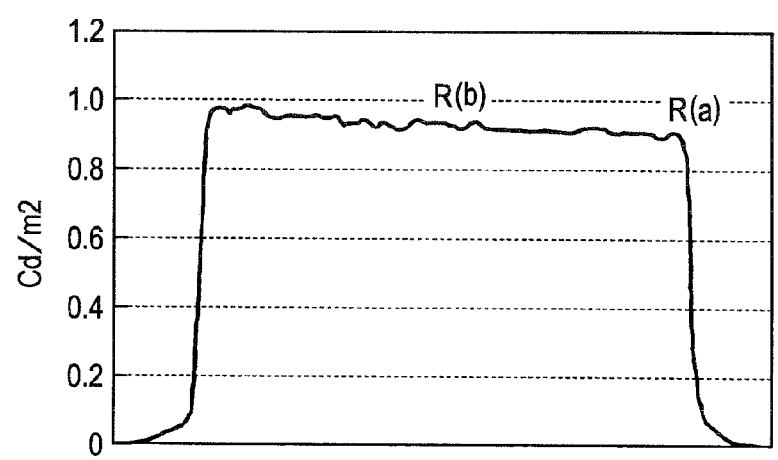
FIG. 8B is a light emission profile.
Figure 9B:
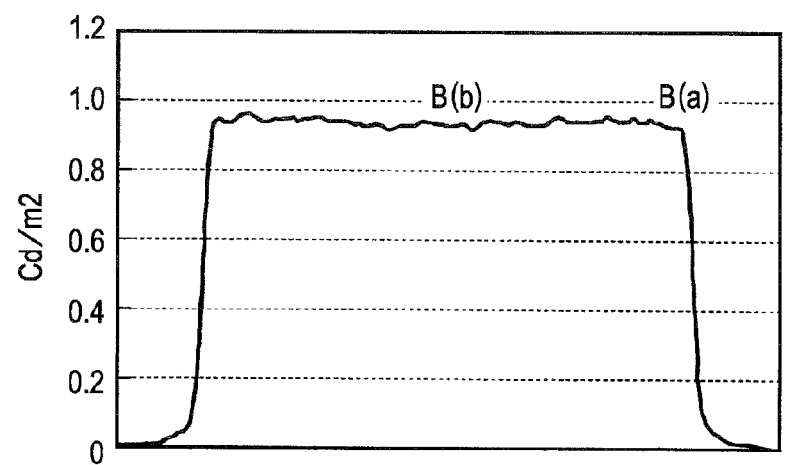
FIG. 9B is a light emission profile.

In addition, the film thickness profile of the functional layer 110 is in the concave shape in the red pixel. On the other hand, the film thickness profile of the functional layer 110 is in the convex shape in the blue pixel. Accordingly, in the center portion (portions of film thicknesses R(b) and B(b)), the film thickness is relatively thin, compared to the periphery portions (portions of the film thicknesses R(a) and B(a)) in which almost the maximum light transmittance (output ratio) is acquired due to the effect of light resonance, whereby the light transmittance (output ratio) becomes low. However, in the periphery portion, the wavelength of light emitted is shifted to the green color side due to the effect of light resonance. Thus, as a result the external luminance (light emission intensity) detected by the eyes, as shown in the light emission profiles shown in FIGS. 8B and 9B, is equivalent to that of the periphery portions, whereby almost uniform luminance for the entirety of the color pixels is acquired.

Accordingly, also in the organic EL device according to this embodiment, the light emission profiles acquired for the red pixel, the blue pixel, and the green pixel are externally observed to be fixed. In addition, the organic EL device has superior light emitting characteristics for which the unevenness of light emission is reduced for any of the color pixels.

EXPERIMENTAL EXAMPLES

The relationship between the film thickness of the light emitting layer and the current efficiency of the light emitting element (organic EL element) was checked in the following manner.

As the light emitting element (organic EL element), the anode was formed to have the same configuration as shown in FIGS. 3 and 4 without forming a partition wall on a glass substrate, and a hole injection layer and a hole transport layer were formed by using a spin-coat method. In addition, the above-described red light emitting material was coated thereon by using the spin-coat method, and a light emitting layer was formed so as to acquire a functional layer. Thereafter, a cathode was formed on the light emitting layer so as to form a light emitting element (organic EL element).

Then, the thickness of the light emitting element (organic EL element), in particular, the thickness of the light emitting layer was changed with maintaining the other configurations, whereby light emitting elements (organic EL elements) of various types were acquired. In addition, the film thickness of the functional layer that was formed by the hole injection layer, the hole transport layer, and the light emitting layer was designed such that the length d1 of the light resonance light path satisfied the above-described Equation (1) particularly when the film thickness of the light emitting layer was 95 nm.

Then, the current efficiency for each of these various types of the light emitting elements (organic EL elements) was checked under the same condition. The acquired result is shown as a graph shown in FIG. 10.

Figure 10:
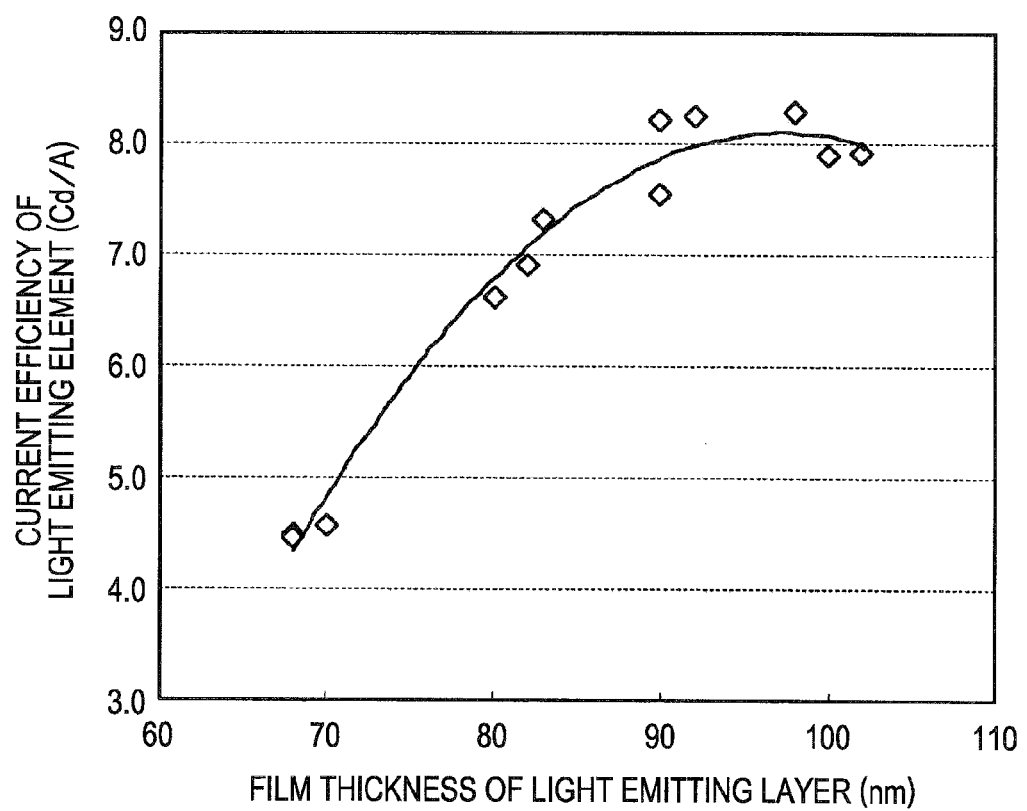
FIG. 10 is a graph showing the relationship between the film thickness of a light emitting layer and the current efficiency of a light emitting element.

Based on the result shown in FIG. 10, when the film thickness of the light emitting layer was 95 nm, the current efficiency was the most preferable as designed. However, it could be known that the current efficiency became almost constant even in a case where the film thickness (that is, the film thickness of the functional layer) was in the ±10% range of the most preferred film thickness. Furthermore, it could be known that the current efficiency became more constant when the film thickness of the light emitting layer was in ±5% range of the most preferable film thickness.

Accordingly, based on the result shown in FIG. 10, it was determined to be preferable to design the film thicknesses R(a) and B(a) so as to satisfy the above-described Equation (2) or (3).

The invention is not limited to the above-described embodiments and may be changed in various forms within the range not departing from the basic idea of the invention. For example, in the above-described embodiment, the film thickness profile of the functional layer of the green pixel has a concave shape. However, when a material having the emission wavelength (λ) over 550 nm is used as the green light emitting material, it is preferable that the film thickness profile of the functional layer is formed to be convex.

In addition, in the above-described embodiments, the functional layer is configured by the hole injection layer, the hole transport layer, and the light emitting layer. However, for example, the functional layer may be configured as a two-layer structure including the hole injection layer and the light emitting layer. Furthermore, a stacked structure acquired by adding an electron transport layer or an electron injection layer to the above-described two-layer structure or three-layer structure may be used.

Figure 11:
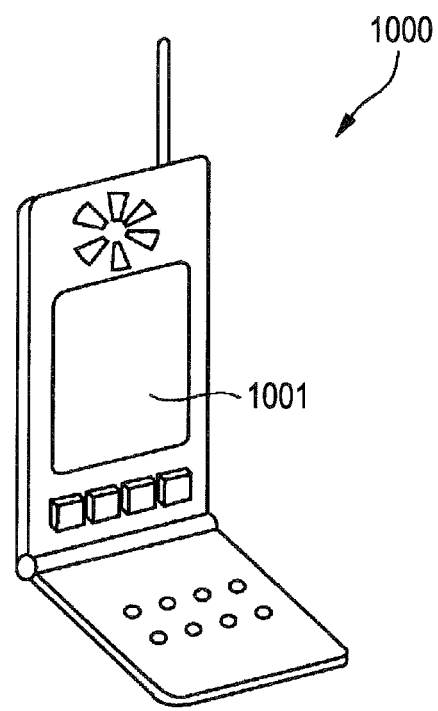
FIG. 11 is a perspective view showing an electronic apparatus according to an embodiment of the invention.

FIG. 11 shows an electronic apparatus according to an embodiment of the invention. The electronic apparatus of this embodiment includes the above-described EL device as its display unit. Here, an example of a cellular phone is shown in the perspective view. A reference numeral 1000 denotes a cellular phone main body, and a reference numeral 1001 denotes the display unit using the above-described organic EL device. As described above, excellent light emitting characteristics can be acquired from the electronic apparatus that includes the above-described organic EL device as its display unit.

In addition, the invention may be applied to various electronic apparatuses other than the cellular phone. For example, the invention may be applied to electronic apparatuses such as a desktop computer, a liquid crystal projector, a multimedia-supported personal computer (PC) or engineering workstation (EWS), a pager, a word processor, a television set, a view-finder type or monitor direct-viewing type video cassette recorder, a wrist-watch-type electronic apparatus, an electronic organizer, an electronic table calculator, a car navigation equipment, a POS terminal, and an apparatus having a touch panel.

The entire disclosure of Japanese Patent Application No. 2008-258587, filed Oct. 3, 2008 and Japanese Patent Application No. 2009-164937, filed Jul. 13, 2009 are expressly incorporated by reference herein.

What is claimed is:

1. An organic EL device comprising an organic EL element that includes an anode having a reflective face, a cathode having a semi-transmissive reflective layer, and a functional layer, which is pinched between the anode and the cathode so that the cathode is in contact with the functional layer and at least one partition wall portion, and includes at least an organic light emitting layer, and configures a color pixel that implements light emission corresponding to at least a red color, wherein the color pixel configured by the organic EL element forms an optical resonator between the reflective face of the anode and the semi-transmissive reflective layer of the cathode, wherein the color pixel corresponding to the red color has a film thickness profile of the functional layer in a concave shape in which the center portion is relatively thin, and the periphery portion is relatively thick, and the film thickness R(a) of the peripheral portion of the concave-shaped functional layer satisfies equations (1) and (2) relating to the length d1 of a resonance light path of the optical resonator, $$2d1 = m\lambda + (\theta an^* \lambda)/2\pi + (\theta ca^* \lambda)/2\pi \quad \text{equation (1):}$$

here, m is an integer, λ is a peak wavelength of the spectrum of light desired to be emitted, θan is the amount of phase shift in the case of reflection from the anode side, and θca is the amount of phase shift in the case of reflection from the cathode side;

$$0.9d1 \leq R(a) \leq 1.1d1, \text{ and} \quad \text{equation (2):}$$

wherein the organic EL elements configure color pixels that implement light emission corresponding to at least the red color and the blue color, wherein the color pixel corresponding to the blue color has a film thickness profile of the functional layer in a convex shape in which the center portion is relatively thick, and the periphery portion is relatively thin.

2. An organic EL device comprising an organic EL element that includes an anode having a reflective face, a cathode having a semi-transmissive reflective layer, and a functional layer, which is pinched between the anode and the cathode so that the cathode is in contact with the functional layer and at least one partition wall portion, and includes at least an organic light emitting layer, and configures a color pixel that implements light emission corresponding to at least a blue color, wherein the color pixel configured by the organic EL element forms an optical resonator between the reflective face of the anode and the semi-transmissive reflective layer of the cathode, and wherein the color pixel corresponding to the blue color has a film thickness profile of the functional layer in a concave shape in which a center portion is relatively thin, and a periphery portion is relatively thick, and the film thickness $B(a)$ of the peripheral portion of the convex-shaped functional layer satisfies Equations (1) and (3) relating to the length $d1$ of a resonance light path of the optical resonator, $$2d1 = m\lambda + (\theta an * \lambda)/2\pi + (\theta ca * \lambda)/2\pi \qquad \text{equation (1):}$$

here, m is an integer, $\lambda$ is a peak wavelength of the spectrum of light desired to be emitted, $\theta an$ is the amount of phase shift in the case of reflection from the anode side, and $\theta ca$ is the amount of phase shift in the case of reflection from the cathode side;

$$0.9d1 \leq B(a) \leq 1.1d1, \qquad \text{equation (3):}$$

wherein the organic EL elements configure color pixels that implement light emission corresponding to at least the blue color and the red color, wherein the color pixel corresponding to the red color has a film thickness profile of the functional layer in a convex shape in which the center portion is relatively thick, and the periphery portion is relatively thin, and the film thickness $R(a)$ of the center portion of the convex-shaped functional layer satisfies the equation (1) and equation (2) relating to the length $d1$ of the resonance light path of the optical resonator, $$0.9d1 \leq R(a) \leq 1.1d1, \qquad \text{equation (2).}$$

3. The organic EL device according to claim 1, wherein the functional layer is formed by using a liquid droplet ejecting method.

4. An electronic apparatus comprising the organic EL device according to claim 1.

* * * * *